United States Patent
Zhou

(10) Patent No.: US 11,430,941 B2
(45) Date of Patent: Aug. 30, 2022

(54) PIEZOELECTRIC POLYVINYLIDENE FLUORIDE MATERIAL, METHOD FOR MANUFACTURING SAME, AND FINGERPRINT RECOGNITION MODULE

(71) Applicant: Wuhan China Star Optoelectronics Technology Co., LTD., Hubei (CN)

(72) Inventor: Yongxiang Zhou, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 596 days.

(21) Appl. No.: 16/485,435

(22) PCT Filed: Apr. 25, 2019

(86) PCT No.: PCT/CN2019/084240
§ 371 (c)(1),
(2) Date: Aug. 12, 2019

(87) PCT Pub. No.: WO2020/107790
PCT Pub. Date: Jun. 4, 2020

(65) Prior Publication Data
US 2021/0336124 A1    Oct. 28, 2021

(30) Foreign Application Priority Data

Nov. 29, 2018  (CN) .......................... 201811446413.7

(51) Int. Cl.
*H01L 41/193*     (2006.01)
*C08K 3/04*       (2006.01)
*B06B 1/06*       (2006.01)
*C09D 7/61*       (2018.01)
*C09D 7/20*       (2018.01)
(Continued)

(52) U.S. Cl.
CPC .......... *H01L 41/193* (2013.01); *B06B 1/0688* (2013.01); *C08F 14/22* (2013.01);
(Continued)

(58) Field of Classification Search
CPC ... H01L 41/193; B06B 1/0688; C09D 127/16; C08K 3/041
See application file for complete search history.

(56) References Cited

U.S. PATENT DOCUMENTS

2013/0260037 A1\* 10/2013 Paiz ...................... C09D 11/36
                                                        427/256
2019/0058106 A1   2/2019 Meng
2019/0284423 A1   9/2019 Bodkhe et al.

FOREIGN PATENT DOCUMENTS

CN         104829976 A      8/2015
CN         105449095 A      3/2016
(Continued)

*Primary Examiner* — Khanh T Nguyen
(74) *Attorney, Agent, or Firm* — Benesch, Friedlander, Coplan & Aronoff, LLP

(57) ABSTRACT

A piezoelectric polyvinylidene fluoride (PVDF) material, a method for manufacturing the same, and a fingerprint recognition module are provided. The polyvinylidene PVDF material includes PVDF, a first solvent, a second solvent, a fluorosurfactant, and an inducing material. Material of the inducing material is one of carbon nanotubes, carbon black, and gold nanorods. Because of the high anisotropy of the inducing material, molecular orientation of the PVDF material is induced, thereby improving piezoelectric performance of the piezoelectric PVDF material. Problems of conventional piezoelectric PVDF materials, which are used in ultrasonic fingerprint recognition modules, such as poor piezoelectric performance and high-energy loss are improved.

10 Claims, 2 Drawing Sheets

(51) Int. Cl.
    *C09D 7/40*     (2018.01)
    *C09D 7/45*     (2018.01)
    *C09D 7/63*     (2018.01)
    *C08F 14/22*    (2006.01)
    *C08K 3/08*     (2006.01)
    *C09D 5/24*     (2006.01)
    *C09D 127/16*   (2006.01)
    *H01L 41/257*   (2013.01)
    *H01L 41/45*    (2013.01)
    *G06V 40/13*    (2022.01)

(52) U.S. Cl.
    CPC ............... *C08K 3/041* (2017.05); *C08K 3/08* (2013.01); *C09D 5/24* (2013.01); *C09D 7/20* (2018.01); *C09D 7/45* (2018.01); *C09D 7/61* (2018.01); *C09D 7/63* (2018.01); *C09D 7/70* (2018.01); *C09D 127/16* (2013.01); *G06V 40/1306* (2022.01); *G06V 40/1329* (2022.01); *H01L 41/257* (2013.01); *H01L 41/45* (2013.01); *B06B 2201/70* (2013.01); *C08K 2003/0831* (2013.01); *C08K 2201/001* (2013.01); *C08K 2201/011* (2013.01)

(56) References Cited

FOREIGN PATENT DOCUMENTS

| | | | |
|---|---|---|---|
| CN | 107462350 | A | 12/2017 |
| CN | 109651900 | A | 4/2019 |
| WO | 2018085936 | A1 | 5/2018 |

\* cited by examiner

PIEZOELECTRIC POLYVINYLIDENE FLUORIDE MATERIAL, METHOD FOR MANUFACTURING SAME, AND FINGERPRINT RECOGNITION MODULE

FIELD OF INVENTION

The present invention relates to a field of fingerprint recognition technology, and more particularly, to a piezoelectric polyvinylidene fluoride material, a method for manufacturing same, and a fingerprint recognition module.

BACKGROUND OF INVENTION

Recently, fingerprint recognition technology is widely used in portable terminals, smart furniture, crime prevention, and other fields. It brings convenience and security to people's lives. Common fingerprint recognition technology includes capacitive fingerprint recognition technology and ultrasonic wave fingerprint recognition technology. The ultrasonic wave fingerprint recognition technology has been spotlighted because it has many advantages in contrast to the capacitive fingerprint recognition technology. Ultrasonic waves are able to scan through a smartphone case made of glass, aluminum, stainless steel, sapphire or plastic. Moreover, the ultrasonic wave fingerprint recognition technology has strong environmental adaptability and can be used in complex environments because it is free from water and oil pollution. As a result, the ultrasonic wave fingerprint recognition technology has been widely used for the security of electronic products like mobile phones, computers, tablets, and access control systems. Compared with a traditional digital password, the ultrasonic wave fingerprint recognition technology allows for rapid fingerprint unlocking. However, conventional piezoelectric materials, which are used in ultrasonic wave fingerprint recognition modules, have problems such as poor piezoelectric performance and high-energy loss. Therefore, it is necessary for scientific research and engineering applications to find a piezoelectric material which has high piezoelectric performance.

SUMMARY OF INVENTION

The present provides a piezoelectric polyvinylidene fluoride material (PVDF), a method for manufacturing the same, and a fingerprint recognition module to solve problems that the piezoelectric properties of piezoelectric materials used in conventional ultrasonic wave fingerprint recognition modules are not ideal and energy loss is large.

To achieve the above goal, the present invention provides a piezoelectric PVDF material, comprising: 3% to 18% by weight of PVDF, 31% to 54% by weight of a first solvent, 26% to 63% by weight of a second solvent, 2% to 4% by weight of a fluorosurfactant, and 0.01% to 0.1% by weight of an inducing material.

The inducing material is one of the carbon nanotubes, carbon black, and gold nanorods.

Furthermore, the first solvent is a dimethyl sulfoxide solvent, and the second solvent is an acetone solvent or a methyl ethyl ketone solvent.

The present invention also provides a method for manufacturing a piezoelectric PVDF material, comprising steps of: providing a thin film transistor (TFT) substrate, producing the above piezoelectric PVDF material, coating the piezoelectric PVDF material on a surface of the TFT substrate, and polarizing the piezoelectric PVDF material.

Furthermore, the step of producing the piezoelectric PVDF material comprises: mixing the PVDF, the first solvent, the second solvent, the fluorosurfactant, and the inducing material to obtain a target solution, and dispersing molecules gathered in the target solution.

Furthermore, a thickness of the piezoelectric PVDF material coated on the surface of the TFT substrate ranges from 1 μm to 100 μm.

Furthermore, the step of polarizing the piezoelectric PVDF material comprises: polarizing the TFT substrate in an electric field, wherein a voltage of the electric field ranges from 10 kV to 50 kV.

Furthermore, the mixing step comprises: adding the PVDF, the second solvent, the fluorosurfactant, and the inducing material into the first solvent sequentially.

Furthermore, the dispersing step comprises: dispersing the molecules gathered in the target solution by ultrasonication.

The present invention also provides a fingerprint recognition module, comprising: a thin film transistor (TFT) substrate, a piezoelectric thin film layer covering the TFT substrate, wherein the piezoelectric thin film layer comprises the above piezoelectric PVDF material.

Furthermore, the fingerprint recognition module further comprises: a display layer covering the piezoelectric thin film layer, a touch control layer covering the display layer, a protection layer covering the touch control layer, and an adhesive disposed between the display layer and the touch control layer.

Regarding the beneficial effects of the present invention, a piezoelectric PVDF material is provided which is made of a conventional PVDF material and an inducing material. The inducing material is one of the carbon nanotubes, carbon black, and gold nanorods. These inducing materials can induce molecular orientation of the PVDF material during the polarization process, thereby improving piezoelectric performance of the PVDF material. Moreover, these inducing materials have excellent mechanical properties which can improve mechanical performance of the PVDF material, thereby improving the detection accuracy of the ultrasonic wave fingerprint recognition and a lifetime of products. A method for manufacturing piezoelectric PVDF material provided by the present invention has advantages such as simple operation, easy availability of raw materials, and less waste. The present invention also provides a fingerprint recognition module including the piezoelectric PVDF material. During the process of mutual conversion of electrical energy and mechanical energy in the fingerprint recognition module, the energy loss is reduced, the detection accuracy of the ultrasonic wave fingerprint recognition is great, and a lifetime of products using the fingerprint recognition module is long.

Figure 1:
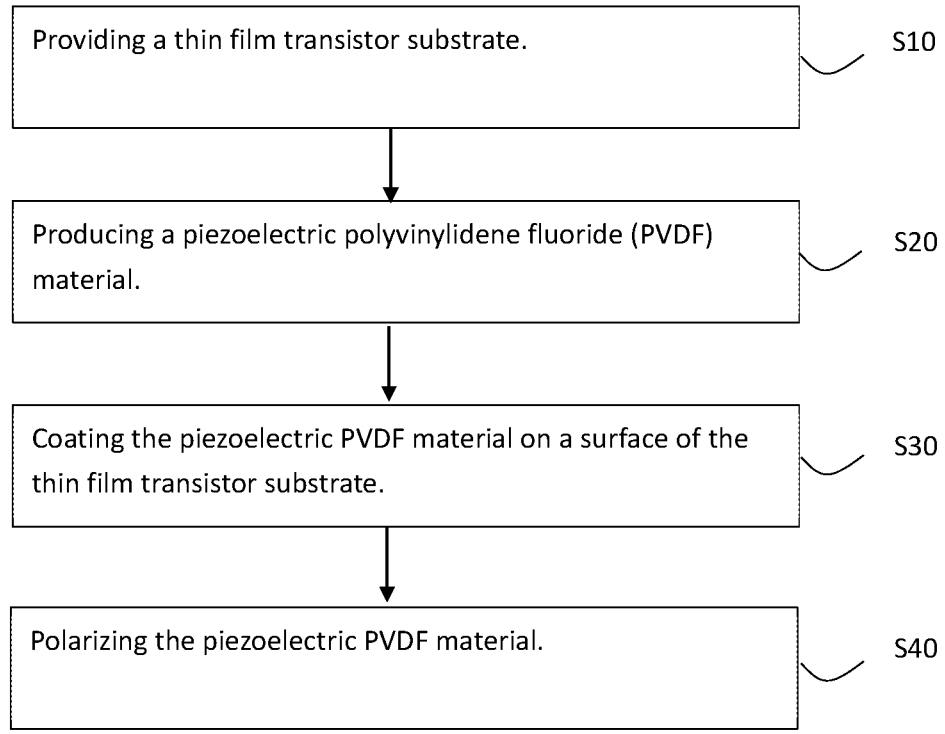
FIG. 1 is a flow diagram of a method for manufacturing a piezoelectric polyvinylidene fluoride (PVDF) material according to an embodiment of the present invention.

Components in the drawings are marked as follows:
fingerprint recognition module 10;
thin film transistor substrate 11; piezoelectric thin film layer 12;
display layer 13; adhesive 14;
touch control layer 15; protection layer 16.

DETAILED DESCRIPTION OF PREFERRED EMBODIMENTS

In order to prove that the present invention can be implemented, three preferred embodiments are described with reference to the accompanying drawings. The preferred embodiments are not intended to limit the present disclosure, and it is understood that many changes and modifications to the described embodiments can be carried out without departing from the scope and the spirit of the disclosure that is intended to be limited only by the appended claims.

In the drawings, the identical or similar reference numerals constantly denote the identical or similar elements or elements having the identical or similar functions. The present invention does not limit the size and thickness of each component. To make the illustration clearer, some parts of the drawings appropriately exaggerate the thickness of the components.

In the description of the present disclosure, it should be understood that terms such as "upper," "lower," "front," "rear," "left," "right," "inside," "outside," as well as derivative thereof should be construed to refer to the orientation as then described or as shown in the drawings under discussion. These relative terms are for convenience of description, do not require that the present invention be constructed or operated in a particular orientation, and shall not be construed as causing limitations to the present invention. Thus, it should be understood that terms such as "first," "second," and "third" and the like are used for descriptive purposes only instead of indicating or implying relative importance of the embodiments.

A component described as being "disposed on" another component may include an embodiment in which the component is directly "disposed on" another component and the component is "disposed on" on an intermediate component, wherein the intermediate component is disposed on another component. In addition, terms such as "mount," "connect," and "bond" should be comprehended in broad sense. For example, it can mean a direct connection, an indirect connection by an intermediate, or an inner communication or an interaction between two components.

First Embodiment

The present embodiment provides a piezoelectric polyvinylidene fluoride (PVDF) material including 3% to 18% by weight of PVDF and 0.01% to 0.1% by weight of an inducing material. The inducing material is carbon nanotubes.

The piezoelectric PVDF material further includes 31% to 54% by weight of a first solvent, 26% to 63% by weight of a second solvent, and 2% to 4% by weight of a fluorosurfactant. The first solvent is a dimethyl sulfoxide solvent, and the second solvent is an acetone solvent or a methyl ethyl ketone solvent.

The present embodiment further provides a method for manufacturing a piezoelectric PVDF material, comprising the following steps:

S10: providing a thin film transistor (TFT) substrate.
S20: producing the piezoelectric PVDF material.
S30: coating the piezoelectric PVDF material on a surface of the TFT substrate, and coating the piezoelectric PVDF material, which had been sonicated, on the other surface of the TFT substrate. A thickness of the piezoelectric PVDF material coated on the surface of the TFT substrate ranges from 1 μm to 100 μm.

S40: polarizing the piezoelectric PVDF material: polarizing the TFT substrate in an electric field, thereby inducing molecular orientation of the PVDF to form a β-crystal PVDF, wherein a voltage of the electric field ranges from 10 kV to 50 kV.

Figure 2:
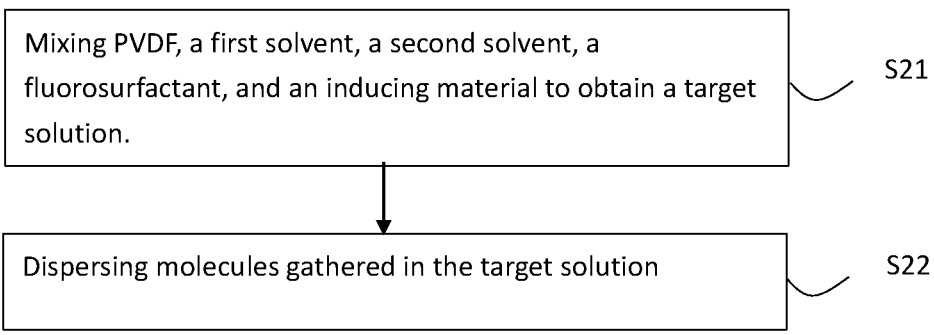
FIG. 2 is a flow diagram of step 20 according to an embodiment of the present invention.

As shown in FIG. 2, the S20 includes the following steps:

S21: mixing the PVDF, the first solvent, the second solvent, the fluorosurfactant, and the inducing material to obtain a target solution: adding the first solvent and the PVDF into a vessel to make the PVDF be fully dissolved in the first solvent. After that, adding the second solvent and the fluorosurfactant into the vessel sequentially to improve effects of dissolution and dispersion. Finally, adding the inducing material into the vessel to obtain a target solution.

In the S21, the first solvent is a dimethyl sulfoxide solvent. The second solvent is an acetone solvent or a methyl ethyl ketone solvent using for improving the dissolution rate and effect of the PVDF. The fluorosurfactant is using for reducing the interfacial tension of the target solution, thereby uniformly dispersing molecules gathered in the target solution. The inducing material is carbon nanotubes which have high anisotropy, which is beneficial to improve mechanical performance and piezoelectric performance of the piezoelectric PVDF material.

S22: dispersing the molecules gathered in the target solution: exposing the target solution to an ultrasonication treatment to uniformly disperse the molecules gathered in the target solution. Finally, the piezoelectric PVDF material is obtained.

Figure 3:
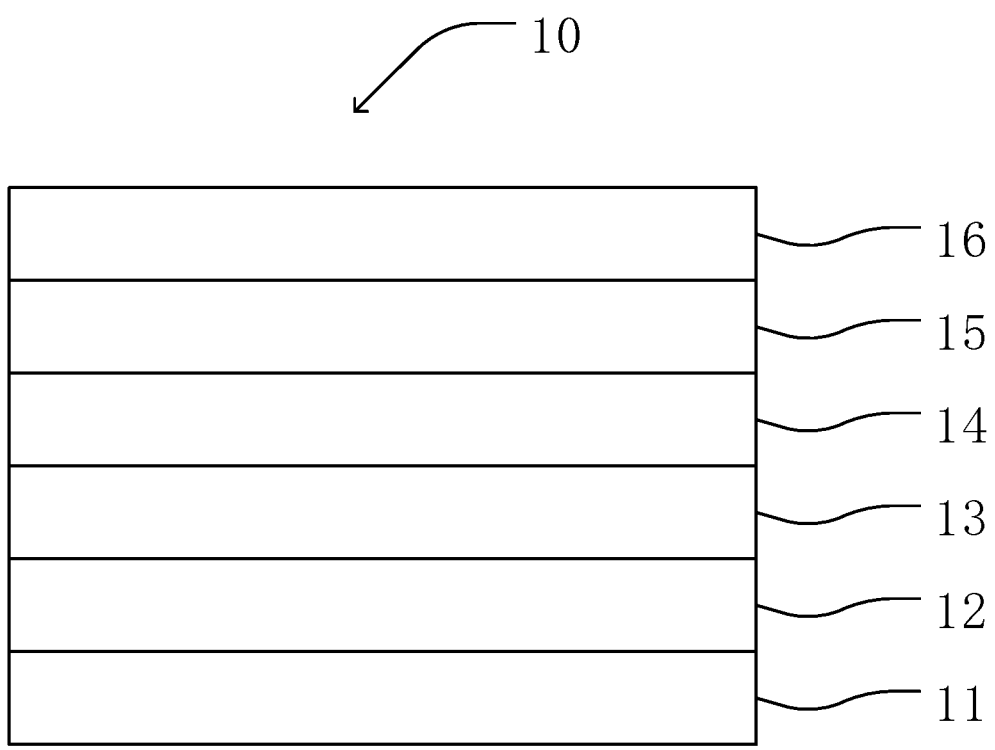
FIG. 3 is a schematic diagram showing a layered fingerprint recognition module according to an embodiment of the present invention.

The present embodiment further provides a fingerprint recognition module 10 which is an ultrasonic wave fingerprint recognition module 10. As shown in FIG. 3, the ultrasonic wave fingerprint recognition module 10 includes a thin film transistor (TFT) substrate 11 and a piezoelectric thin film layer 12 covering the TFT substrate 11. The piezoelectric thin film layer 12 includes the piezoelectric PVDF material. The ultrasonic wave fingerprint recognition module 10 further includes a display layer 13, a touch control layer 15, a protection layer 16 and an adhesive 14. The display layer 13 is covering the piezoelectric thin film layer 12, the display layer 15 is covering the display layer 13, and the protection layer 16 is covering the touch control layer 15. The adhesive 14 is disposed between the display layer 13 and the touch control layer 15. The adhesive 14 is using for bonding the touch control layer 15 to the display layer 13.

When the ultrasonic wave fingerprint recognition module 10 identifies a fingerprint, a voltage is applied to the piezoelectric thin film layer 12 by the thin film transistor substrate 11, thereby causing high-frequency vibration of the piezoelectric thin film layer 12 to generate and emit ultrasonic waves. The ultrasonic waves are reflected back into the fingerprint recognition module 10 after reaching a finger, thereby causing the piezoelectric film layer 12 to vibrate again. The vibration of the piezoelectric thin film layer 12 also causes the thin film transistor substrate 11 to generate the voltage. The transmission and reception of the ultrasonic waves are achieved by switching between the electrical energy of the thin film transistor substrate 11 and the mechanical energy of the piezoelectric thin film layer 12.

In the present embodiment, an inducing material and carbon nanotubes are added to the piezoelectric PVDF material. Because of the high anisotropy of the carbon nanotubes, molecular orientation of the PVDF material is induced to form a β-crystal PVDF during the polarizing step. Therefore, piezoelectric performance of the piezoelectric PVDF material is improved. Because of the exceptional mechanical properties of the carbon nanotubes, mechanical properties of the piezoelectric PVDF material is improved, thereby improving the detection accuracy of the ultrasonic wave fingerprint recognition and a lifetime of products. A method for manufacturing piezoelectric PVDF material provided by the present embodiment has advantages such as simple operation, easy availability of raw materials, and less waste. The present embodiment also provides a fingerprint recognition module including the piezoelectric PVDF material. During the process of mutual conversion of electrical energy and mechanical energy in the fingerprint recognition module, the energy loss is reduced, the detection accuracy of the ultrasonic wave fingerprint recognition is great, and a lifetime of products using the fingerprint recognition module is long.

Second Embodiment

The present embodiment provides a piezoelectric polyvinylidene fluoride (PVDF) material including 3% to 18% by weight of PVDF and 0.01% to 0.1% by weight of an inducing material. The inducing material is carbon black.

The piezoelectric PVDF material further includes 31% to 54% by weight of a first solvent, 26% to 63% by weight of a second solvent, and 2% to 4% by weight of a fluorosurfactant. The first solvent is a dimethyl sulfoxide solvent, and the second solvent is an acetone solvent or a methyl ethyl ketone solvent.

The present embodiment further provides a method for manufacturing a piezoelectric PVDF material, comprising the following steps:

S10: providing a thin film transistor (TFT) substrate.

S20: producing the piezoelectric PVDF material.

S30: coating the piezoelectric PVDF material on a surface of the TFT substrate, and coating the piezoelectric PVDF material, which had been sonicated, on the other surface of the TFT substrate. A thickness of the piezoelectric PVDF material coated on the surface of the TFT substrate ranges from 1 μm to 100 μm.

S40: polarizing the piezoelectric PVDF material: polarizing the TFT substrate in an electric field, thereby inducing molecular orientation of the PVDF to form a β-crystal PVDF, wherein a voltage of the electric field ranges from 10 kV to 50 kV.

As shown in FIG. 2, the S20 includes the following steps:

S21: mixing the PVDF, the first solvent, the second solvent, the fluorosurfactant, and the inducing material to obtain a target solution: adding the first solvent and the PVDF into a vessel to make the PVDF be fully dissolved in the first solvent. After that, adding the second solvent and the fluorosurfactant into the vessel sequentially to improve effects of dissolution and dispersion. Finally, adding the inducing material into the vessel to obtain a target solution.

In the S21, the first solvent is a dimethyl sulfoxide solvent. The second solvent is an acetone solvent or a methyl ethyl ketone solvent using for improving the dissolution rate and effect of the PVDF. The fluorosurfactant is using for reducing the interfacial tension of the target solution, thereby uniformly dispersing molecules gathered in the target solution. The inducing material is carbon black which has high anisotropy, which is beneficial to improve mechanical performance and piezoelectric performance of the piezoelectric PVDF material.

S22: dispersing the molecules gathered in the target solution: exposing the target solution to an ultrasonication treatment to uniformly disperse the molecules gathered in the target solution. Finally, the piezoelectric PVDF material is obtained.

The present embodiment further provides a fingerprint recognition module 10 which is an ultrasonic wave fingerprint recognition module 10. As shown in FIG. 3, the ultrasonic wave fingerprint recognition module 10 includes a thin film transistor (TFT) substrate 11 and a piezoelectric thin film layer 12 covering the TFT substrate 11. The piezoelectric thin film layer 12 includes the piezoelectric PVDF material. The ultrasonic wave fingerprint recognition module 10 further includes a display layer 13, a touch control layer 15, a protection layer 16 and an adhesive 14. The display layer 13 is covering the piezoelectric thin film layer 12, the display layer 15 is covering the display layer 13, and the protection layer 16 is covering the touch control layer 15. The adhesive 14 is disposed between the display layer 13 and the touch control layer 15. The adhesive 14 is using for bonding the touch control layer 15 to the display layer 13.

When the ultrasonic wave fingerprint recognition module 10 identifies a fingerprint, a voltage is applied to the piezoelectric thin film layer 12 by the thin film transistor substrate 11, thereby causing high-frequency vibration of the piezoelectric thin film layer 12 to generate and emit ultrasonic waves. The ultrasonic waves are reflected back into the fingerprint recognition module 10 after reaching a finger, thereby causing the piezoelectric film layer 12 to vibrate again. The vibration of the piezoelectric thin film layer 12 also causes the thin film transistor substrate 11 to generate the voltage. The transmission and reception of the ultrasonic waves are achieved by switching between the electrical energy of the thin film transistor substrate 11 and the mechanical energy of the piezoelectric thin film layer 12.

In the present embodiment, an inducing material and carbon black are added to the piezoelectric PVDF material. Because of the high anisotropy of the carbon black, molecular orientation of the PVDF material is induced to form a β-crystal PVDF during the polarizing step. Therefore, piezoelectric performance of the piezoelectric PVDF material is improved. Because of the exceptional mechanical properties of the carbon black, mechanical properties of the piezoelectric PVDF material is improved, thereby improving the detection accuracy of the ultrasonic wave fingerprint recognition and a lifetime of products. A method for manufacturing piezoelectric PVDF material provided by the present embodiment has advantages such as simple operation, easy availability of raw materials, and less waste. The present embodiment also provides a fingerprint recognition module including the piezoelectric PVDF material. During the process mutual conversion of electrical energy and mechanical energy in the fingerprint recognition module, the energy loss is reduced, the detection accuracy of the ultrasonic wave fingerprint recognition is great, and a lifetime of products using the fingerprint recognition module is long.

Third Embodiment

The present embodiment provides a piezoelectric polyvinylidene fluoride (PVDF) material including 3% to 18% by weight of PVDF and 0.01% to 0.1% by weight of an inducing material. The inducing material is gold nanorods.

The piezoelectric PVDF material further includes 31% to 54% by weight of a first solvent, 26% to 63% by weight of a second solvent and 2% to 4% by weight of a fluorosurfactant. The first solvent is a dimethyl sulfoxide solvent, and the second solvent is an acetone solvent or a methyl ethyl ketone solvent.

The present embodiment further provides a method for manufacturing a piezoelectric PVDF material, comprising the following steps:

S10: providing a thin film transistor (TFT) substrate.

S20: producing the piezoelectric PVDF material.

S30: coating the piezoelectric PVDF material on a surface of the TFT substrate, and coating the piezoelectric PVDF material, which had been sonicated, on the other surface of the TFT substrate. A thickness of the piezoelectric PVDF material coated on the surface of the TFT substrate ranges from 1 μm to 100 μm.

S40: polarizing the piezoelectric PVDF material: polarizing the TFT substrate in an electric field, thereby inducing molecular orientation of the PVDF to form a β-crystal PVDF, wherein a voltage of the electric field ranges from 10 kV to 50 kV.

As shown in FIG. 2, the S20 includes the following steps:

S21: mixing the PVDF, the first solvent, the second solvent, the fluorosurfactant, and the inducing material to obtain a target solution: adding the first solvent and the PVDF into a vessel to make the PVDF be fully dissolved in the first solvent. After that, adding the second solvent and the fluorosurfactant into the vessel sequentially to improve effects of dissolution and dispersion. Finally, adding the inducing material into the vessel to obtain a target solution.

In the S21, the first solvent is a dimethyl sulfoxide solvent. The second solvent is an acetone solvent or a methyl ethyl ketone solvent using for improving the dissolution rate and effect of the PVDF. The fluorosurfactant is using for reducing the interfacial tension of the target solution, thereby uniformly dispersing molecules gathered in the target solution. The inducing material is gold nanorods which have high anisotropy, which is beneficial to improve mechanical performance and piezoelectric performance of the piezoelectric PVDF material.

S22: dispersing the molecules gathered in the target solution: exposing the target solution to an ultrasonication treatment to uniformly disperse the molecules gathered in the target solution. Finally, the piezoelectric PVDF material is obtained.

The present embodiment further provides a fingerprint recognition module 10 which is an ultrasonic wave fingerprint recognition module 10. As shown in FIG. 3, the ultrasonic wave fingerprint recognition module 10 includes a thin film transistor (TFT) substrate 11 and a piezoelectric thin film layer 12 covering the TFT substrate 11. The piezoelectric thin film layer 12 includes the piezoelectric PVDF material. The ultrasonic wave fingerprint recognition module 10 further includes a display layer 13, a touch control layer 15, a protection layer 16 and an adhesive 14. The display layer 13 is covering the piezoelectric thin film layer 12, the display layer 15 is covering the display layer 13, and the protection layer 16 is covering the touch control layer 15. The adhesive 14 is disposed between the display layer 13 and the touch control layer 15. The adhesive 14 is using for bonding the touch control layer 15 to the display layer 13.

When the ultrasonic wave fingerprint recognition module 10 identifies a fingerprint, a voltage is applied to the piezoelectric thin film layer 12 by the thin film transistor substrate 11, thereby causing high-frequency vibration of the piezoelectric thin film layer 12 to generate and emit ultrasonic waves. The ultrasonic waves are reflected back into the fingerprint recognition module 10 after reaching a finger, thereby causing the piezoelectric film layer 12 to vibrate again. The vibration of the piezoelectric thin film layer 12 also causes the thin film transistor substrate 11 to generate the voltage. The transmission and reception of the ultrasonic waves are achieved by switching between the electrical energy of the thin film transistor substrate 11 and the mechanical energy of the piezoelectric thin film layer 12.

In the present embodiment, an inducing material and gold nanorods are added to the piezoelectric PVDF material. Because of the high anisotropy of the gold nanorods, molecular orientation of the PVDF material is induced to form a β-crystal PVDF during the polarizing step. Therefore, piezoelectric performance of the piezoelectric PVDF material is improved. Because of the exceptional mechanical properties of the gold nanorods, mechanical properties of the piezoelectric PVDF material is improved, thereby improving the detection accuracy of the ultrasonic wave fingerprint recognition and a lifetime of products. A method for manufacturing piezoelectric PVDF material provided by the present embodiment has advantages such as simple operation, easy availability of raw materials, and less waste. The present embodiment also provides a fingerprint recognition module including the piezoelectric PVDF material. During the process mutual conversion of electrical energy and mechanical energy in the fingerprint recognition module, the energy loss is reduced, the detection accuracy of the ultrasonic wave fingerprint recognition is great, and a lifetime of products using the fingerprint recognition module is long.

Although the present invention has been described herein with reference to specific embodiments. However, it should be noted that these embodiments are merely examples of the principles and applications of the present invention. The preferred embodiment is not intended to limit the present invention, and it is understood that many changes and modifications to the described embodiment can be carried out without departing from the scope and the spirit of the disclosure that is intended to be limited only by the appended claims. Furthermore, features described in the individual embodiments can be used in other described embodiments.

What is claimed is:

1. A piezoelectric polyvinylidene fluoride (PVDF) material, comprising:
   3% to 18% by weight of PVDF;
   31% to 54% by weight of a first solvent;
   26% to 63% by weight of a second solvent;
   2% to 4% by weight of a fluorosurfactant; and
   0.01% to 0.1% by weight of an inducing material;
   wherein the inducing material is one of carbon nanotubes, carbon black, and gold nanorods.

2. The piezoelectric PVDF material of claim 1, wherein the first solvent is a dimethyl sulfoxide solvent; and
   the second solvent is an acetone solvent or a methyl ethyl ketone solvent.

3. A method for manufacturing a piezoelectric polyvinylidene fluoride (PVDF) material, comprising steps of:
   providing a thin film transistor (TFT) substrate;
   producing the piezoelectric PVDF material of claim 1;
   coating the piezoelectric PVDF material on a surface of the TFT substrate; and
   polarizing the piezoelectric PVDF material.

4. The method for claim 3, wherein the step of producing the piezoelectric PVDF material comprises:
   mixing the PVDF, the first solvent, the second solvent, the fluorosurfactant, and the inducing material to obtain a target solution; and
   dispersing molecules gathered in the target solution.

5. The method for claim 3, wherein a thickness of the piezoelectric PVDF material coated on the surface of the TFT substrate ranges from 1 μm to 100 μm.

6. The method for claim 3, wherein the step of polarizing the piezoelectric PVDF material comprises:
   polarizing the TFT substrate in an electric field, wherein a voltage of the electric field ranges from 10 kV to 50 kV.

7. The method for claim 4, wherein the mixing step comprises:
   adding the PVDF, the second solvent, the fluorosurfactant, and the inducing material into the first solvent sequentially.

8. The method for claim 4, wherein the dispersing step comprises:
   dispersing the molecules gathered in the target solution by ultrasonication.

9. A fingerprint recognition module, comprising:
   a thin film transistor (TFT) substrate;
   a piezoelectric thin film layer covering the TFT substrate;
   wherein the piezoelectric thin film layer comprises the piezoelectric polyvinylidene fluoride (PVDF) material of claim 1.

10. The fingerprint recognition module of claim 9, further comprising:
   a display layer covering the piezoelectric thin film layer;
   a touch control layer covering the display layer;
   a protection layer covering the touch control layer; and
   an adhesive disposed between the display layer and the touch control layer.

* * * * *